US006618257B1

(12) United States Patent
Cady et al.

(10) Patent No.: US 6,618,257 B1
(45) Date of Patent: Sep. 9, 2003

(54) WIDE DATA PATH STACKING SYSTEM AND METHOD

(75) Inventors: James Cady, Austin, TX (US); David L. Roper, Austin, TX (US); James G. Wilder, Austin, TX (US); Julian Dowden, Austin, TX (US); Jeff Buchle, Austin, TX (US)

(73) Assignee: Staktek Group, L.P., Austin, TX (US)

( * ) Notice: Subject to any disclaimer, the term of this patent is extended or adjusted under 35 U.S.C. 154(b) by 0 days.

(21) Appl. No.: 09/916,625

(22) Filed: Jul. 27, 2001

(51) Int. Cl.$^7$ .......................... H05K 7/00; H01L 23/02; H01L 23/48; H01L 23/52
(52) U.S. Cl. ...................... 361/728; 361/679; 257/686; 257/773; 257/774; 257/777
(58) Field of Search .................. 257/676, 686, 257/693, 781, 774, 778, 736, 731, 777, 666, 684, 700–703, 787; 174/52.4, 52.3, 52.6, 51, 52.1, 52.2; 361/767, 813, 728; 29/827, 830–855; 438/107–112

(56) References Cited

U.S. PATENT DOCUMENTS

| | | | | |
|---|---|---|---|---|
| 5,484,959 A | * | 1/1996 | Burns | 174/52.4 |
| 6,153,929 A | * | 11/2000 | Moden | 257/686 |
| 6,207,474 B1 | * | 3/2001 | King | 438/107 |
| 6,335,565 B1 | * | 1/2002 | Miyamoto | 257/686 |
| 6,426,560 B1 | * | 7/2002 | Kawamura et al. | 257/777 |

* cited by examiner

*Primary Examiner*—David Martin
*Assistant Examiner*—Michael L. Lindinger
(74) *Attorney, Agent, or Firm*—J. Scott Denko; Andrew Kurth, L.L.P.

(57) ABSTRACT

Provided is a system and method for selectively stacking and interconnecting integrated circuit devices having a data path of n-bits to create a high-density integrated circuit module having a data path of greater than n-bits. Integrated circuits are vertically stacked one above the other. Where the constituent IC elements have a data path of n-bits in width, a module devised in accordance with a preferred embodiment of the present invention presents a data path 2n-bits wide. In a preferred embodiment, an interconnection frame comprised of printed circuit board material is disposed about two similarly oriented ICs to provide interconnectivity of the constituent ICs and concatenation of their respective data paths. An array of clip-leads or other connectors are appended to module connection pads to provide lead-like structures for connection of the module to its operating environment. In a two-high stack, address lines of the constituent ICs are interconnected, while the data lines of the respective ICs are concatenated to double the data path width of the stack relative to the data path width of the constituent ICs. In an alternative preferred embodiment, two facially juxtaposed TSOP ICs are surface mounted to an interconnection body laterally positioned between the ICs. The interconnection body has IC connection pads and a set of module connection pads for connection of the module. The interconnection body has a network of connections that interconnects the address lines of the constituent ICs and concatenates the data lines to double the data path width of the stack relative to the data path width of the ICs from which the stack is composed.

34 Claims, 11 Drawing Sheets

| Pin Numb | Name | | Pin 1-33 | | | Pin 66-34 | | Pin 66-34 | | Name | Pin Numb |
|---|---|---|---|---|---|---|---|---|---|---|---|
| | | | | | A | | | | | | |
| | | | | | B | | | | | | |
| | | | | | | | | | C | | |
| 1 | Vdd | | 1 | Vdd | | 1 | Vss | 66 | Vss | Vss | 86 |
| 2 | DQ0 | | 2 | DQ0 | | | DQ15 | 65 | DQ15 | DQ31 | 85 |
| 3 | DQ16 | | 3 | Vddq | | | Vssq | 64 | Vssq | DQ15 | 84 |
| 4 | Vssq | | 4 | DQ1 | | | DQ14 | 63 | DQ14 | Vddq | 83 |
| 5 | DQ1 | | | | | | | | | DQ30 | 82 |
| 6 | DQ17 | | 5 | DQ2 | | | DQ13 | 62 | DQ13 | DQ14 | 81 |
| 7 | Vddq | | | | | | | | | Vssq | 80 |
| 8 | DQ2 | | 6 | Vssq | | | Vddq | 61 | Vddq | DQ29 | 79 |
| 9 | DQ18 | | 7 | DQ3 | | | DQ12 | 60 | DQ12 | DQ13 | 78 |
| 10 | Vssq | | | | | | | | | DQ28 | 77 |
| 11 | DQ3 | | 8 | DQ4 | | | DQ11 | 59 | DQ11 | DQ12 | 76 |
| 12 | DQ19 | | | | | | | | | Vssq | 75 |
| 13 | Vddq | | 9 | Vddq | | | Vssq | 58 | Vssq | DQ27 | 74 |
| 14 | DQ4 | | 10 | DQ5 | | | DQ10 | 57 | DQ10 | DQ11 | 73 |
| 15 | DQ20 | | | | | | | | | Vddq | 72 |
| 16 | Vssq | | 11 | DQ6 | | | DQ9 | 56 | DQ9 | DQ26 | 71 |
| 17 | DQ5 | | | | | | | | | DQ10 | 70 |
| 18 | DQ21 | | 12 | Vssq | | | Vddq | 55 | Vddq | Vssq | 69 |
| 19 | Vddq | | 13 | DQ7 | | | DQ8 | 54 | DQ8 | DQ25 | 68 |
| 20 | DQ6 | | 14 | NC | | | NC | 53 | NC | DQ9 | 67 |
| 21 | DQ22 | | 15 | Vddq | | | Vssq | 52 | Vssq | Vddq | 66 |
| 22 | Vssq | | 16 | LDQS | | | UDQS | 51 | UDQS | DQ24 | 65 |
| 23 | DQ7 | | 17 | NC | | | NC | 50 | NC | DQ8 | 64 |
| 24 | DQ23 | | 18 | Vdd | | | Vref | 49 | Vref | Vss | 63 |
| 25 | NC | | 19 | NC/QFC | | | Vss | 48 | Vss | DQS3 | 62 |
| 26 | DQS0 | | 20 | LDM | | | UDM | 47 | UDM | DM1 | 61 |
| 27 | DQS2 | | 21 | /WE | | | /CK | 46 | /CK | DM3 | 60 |
| 28 | NC/QFC | | 22 | /CAS | | | Ck | 45 | Ck | Vss | 59 |
| 29 | DM0 | | 23 | /RAS | | | CKE | 44 | CKE | CKE | 58 |
| 30 | DM2 | | 24 | /CS | | | NC | 43 | NC | CKE | 57 |
| 31 | /WE | | 25 | NC | | | A12 | 42 | A12 | Vss | 56 |
| 32 | /CAS | | 26 | BA0 | | | A11 | 41 | A11 | CKE | 55 |
| 33 | /RAS | | 27 | BA1 | | | A9 | 40 | A9 | Ck | 54 |
| 34 | /CS | | 28 | AP/A10 | | | A8 | 39 | A8 | CKE | 53 |
| 35 | NC | | 29 | A0 | | | A7 | 38 | A7 | A12 | 52 |
| 36 | Vdd | | 30 | A1 | | | A6 | 37 | A6 | A11 | 51 |
| 37 | BA0 | | 31 | A2 | | | A5 | 36 | A5 | A9 | 50 |
| 38 | BA1 | | 32 | A3 | | | A4 | 35 | A4 | A8 | 49 |
| 39 | AP/A10 | | 33 | Vdd | | | Vss | 34 | Vss | A7 | 48 |
| 40 | A0 | | | | | | | | | A6 | 47 |
| 41 | A1 | | | | | | | | | A5 | 46 |
| 42 | A2 | | | | | | | | | A4 | 45 |
| 43 | A3 | | | | | | | | | Vss | 44 |

| Pin Numb | Name | Pin 1-33 | | Pin 66-34 | | Pin 1-33 | | Pin 66-34 | | Name | Pin Numb |
|---|---|---|---|---|---|---|---|---|---|---|---|
| 1 | Vdd | 1 | Vdd | 66 | Vss | 1 | Vdd | 66 | Vss | Vss | 86 |
| 2 | DQ0 | 2 | DQ0 | 65 | DQ15 | 2 | DQ0 | 65 | DQ15 | DQ16 | 85 |
| 3 | DQ31 | 3 | Vddq | 64 | Vssq | 3 | Vddq | 64 | Vssq | DQ15 | 84 |
| 4 | Vssq | 4 | DQ1 | 63 | DQ14 | 4 | DQ1 | 63 | DQ14 | Vddq | 83 |
| 5 | DQ1 | 5 | DQ2 | 62 | DQ13 | 5 | DQ2 | 62 | DQ13 | DQ17 | 82 |
| 6 | DQ30 | 6 | Vssq | 61 | Vddq | 6 | Vssq | 61 | Vddq | DQ14 | 81 |
| 7 | Vddq | 7 | DQ3 | 60 | DQ12 | 7 | DQ3 | 60 | DQ12 | Vssq | 80 |
| 8 | DQ2 | 8 | DQ4 | 59 | DQ11 | 8 | DQ4 | 59 | DQ11 | DQ18 | 79 |
| 9 | DQ29 | 9 | Vddq | 58 | Vssq | 9 | Vddq | 58 | Vssq | DQ13 | 78 |
| 10 | Vssq | 10 | DQ5 | 57 | DQ10 | 10 | DQ5 | 57 | DQ10 | Vddq | 77 |
| 11 | DQ3 | 11 | DQ6 | 56 | DQ9 | 11 | DQ6 | 56 | DQ9 | DQ19 | 76 |
| 12 | DQ28 | 12 | Vssq | 55 | Vddq | 12 | Vssq | 55 | Vddq | DQ12 | 75 |
| 13 | Vddq | 13 | DQ7 | 54 | DQ8 | 13 | DQ7 | 54 | DQ8 | Vssq | 74 |
| 14 | DQ4 | 14 | NC | 53 | NC | 14 | NC | 53 | NC | DQ20 | 73 |
| 15 | DQ27 | 15 | Vddq | 52 | Vssq | 15 | Vddq | 52 | Vssq | DQ11 | 72 |
| 16 | Vssq | 16 | LDQS | 51 | UDQS | 16 | LDQS | 51 | UDQS | Vddq | 71 |
| 17 | DQ5 | 17 | NC | 50 | NC | 17 | NC | 50 | NC | DQ21 | 70 |
| 18 | DQ26 | 18 | Vdd | 49 | Vref | 18 | Vdd | 49 | Vref | DQ10 | 69 |
| 19 | Vddq | 19 | NC/QFC | 48 | Vss | 19 | NC/QFC | 48 | Vss | Vssq | 68 |
| 20 | DQ6 | 20 | LDM | 47 | UDM | 20 | LDM | 47 | UDM | DQ22 | 67 |
| 21 | DQ25 | 21 | /WE | 46 | /CK | 21 | /WE | 46 | /CK | DQ9 | 66 |
| 22 | Vssq | 22 | /CAS | 45 | CK | 22 | /CAS | 45 | CK | Vddq | 65 |
| 23 | DQ7 | 23 | /RAS | 44 | CKE | 23 | /RAS | 44 | CKE | DQ23 | 64 |
| 24 | DQ24 | 24 | /CS | 43 | NC | 24 | /CS | 43 | NC | DQ8 | 63 |
| 25 | Vddq | 25 | NC | 42 | A12 | 25 | NC | 42 | A12 | Vss | 62 |
| 26 | DQS0 | 26 | BA0 | 41 | A11 | 26 | BA0 | 41 | A11 | DQS1 | 61 |
| 27 | DQS3 | 27 | BA1 | 40 | A9 | 27 | BA1 | 40 | A9 | DQS2 | 60 |
| 28 | NC/QFC | 28 | AP/A10 | 39 | A8 | 28 | AP/A10 | 39 | A8 | Vref | 59 |
| 29 | DM0 | 29 | A0 | 38 | A7 | 29 | A0 | 38 | A7 | DM1 | 58 |
| 30 | DM3 | 30 | A1 | 37 | A6 | 30 | A1 | 37 | A6 | DM2 | 57 |
| 31 | /WE | 31 | A2 | 36 | A5 | 31 | A2 | 36 | A5 | /CK | 56 |
| 32 | /CAS | 32 | A3 | 35 | A4 | 32 | A3 | 35 | A4 | CK | 55 |
| 33 | /RAS | 33 | Vdd | 34 | Vss | 33 | Vdd | 34 | Vss | Vss | 54 |
| 34 | /CS | | | | | | | | | CKE | 53 |
| 35 | NC | | | | | | | | | A12 | 52 |
| 36 | BA0 | | | | | | | | | A11 | 51 |
| 37 | BA1 | | | | | | | | | A9 | 50 |
| 38 | AP/A10 | | | | | | | | | A8 | 49 |
| 39 | A0 | | | | | | | | | A7 | 48 |
| 40 | A1 | | | | | | | | | A6 | 47 |
| 41 | A2 | | | | | | | | | A5 | 46 |
| 42 | A3 | | | | | | | | | A4 | 45 |
| 43 | Vdd | | | | | | | | | Vss | 44 |

Fig. 11

| Pin Name | Label | Data Output Pins |
|---|---|---|
| Input Data Mask 0 | DM0 | DQ0 - DQ7 |
| Output Data Strobe 0 | DQS0 | |
| Input Data Mask 1 | DM1 | DQ8 - DQ15 |
| Output Data Strobe 1 | DQS1 | |
| Input Data Mask 2 | DM2 | DQ16 - DQ23 |
| Output Data Strobe 2 | DQS2 | |
| Input Data Mask 3 | DM3 | DQ24 - DQ31 |
| Output Data Strobe 3 | DQS3 | |

WIDE DATA PATH STACKING SYSTEM AND METHOD

TECHNICAL FIELD

The present invention relates to aggregating integrated circuits and, in particular, to stacking integrated circuits.

BACKGROUND OF THE INVENTION

A variety of techniques are used to stack integrated circuits. Some techniques stack circuits encapsulated in special packages, while other methods stack conventional integrated circuit (IC) packages. Some techniques rely principally on the IC leads to create the stack and interconnect the constituent ICs. In other methods, structures such as rails are employed create the stack and interconnect the ICs. In still other techniques, flexible conductors with certain characteristics are used to selectively interconnect the constituent IC elements of the stack.

In some stack configurations, printed circuit board supports an interconnection network employed to provide interelement connectivity. For example, in U.S. Pat. No. Re. 36,916 to Moshayedi, a technique is described for creating a multi-chip module that purportedly uses PCB sideboards to mount an assembly of surface-mount packaged chips to the main or motherboard. The constituent ICs are interconnected on their lead-emergent sides through printed circuit boards (PCBs) oriented vertically to a carrier or motherboard connected to connective sites along the bottom edge of the PCBs. Other systems also purport to use sideboard structures. For example, Japanese Patent Laid-open Publication No. Hei 6-77644 discloses vertical PCBs used as sideboards to interconnect packaged circuit elements of the stack.

Others have stacked integrated circuits without casings or carrier plates. Electrical conductors are provided at the edges of the semiconductor bodies and extended perpendicularly to the planes of the circuit bodies. Such a system is shown in U.S. Pat. No. 3,746,934 to Stein.

Still others have stacked packaged circuits using interconnection packages similar to the packages within which the integrated circuits of the stack are contained to appropriately route functionally similar terminal leads in non-corresponding lead positions. An example is found in U.S. Pat. No. 4,398,235 to Lutz et al. Simple piggyback stacking of DIPs has been shown in U.S. Pat. No. 4,521,828 to Fanning.

Some more recent methods have employed rail-like structures to provide interconnection and structural integrity to the aggregated stack. The rails are either discrete elements that are added to the structure or are crafted from specific orientations of the leads of the constituent circuit packages. For example, in U.S. Pat. No. 5,266,834 to Nishi et al., one depicted embodiment illustrates a stack created by selective orientation of the leads of particularly configured stack elements, while in U.S. Pat. No. 5,343,075 to Nishino, a stack of semiconductor devices is created with contact plates having connective lines on inner surfaces to connect the elements of the stack.

Other sophisticated techniques have been recently developed for stacking integrated circuits. One recent technique developed by the assignee of the present invention interconnects conventionally packaged ICs with a flexible circuit disposed between stack elements. The flexible circuit includes an array of flexible conductors supported by insulating sheets. Terminal portions of the flexible conductors are bent and positioned to interconnect appropriate leads of respective upper and lower IC packages.

One of the more widely employed circuit packages used in high density circuit module stacks is the thin small outline package commonly know as the "TSOP". A variety of circuits are available in TSOP packages. For example, a TSOP may contain a double data rate ("DDR") memory circuit or a single data rate ("SDR") memory circuit. DDR and SDR memory circuits in TSOP packages are generally available in 4-bit, 8-bit, and 16-bit wide data path configurations.

As control and embedded applications migrate to wider data path microprocessors and 64-bit microprocessors move into server and other general purpose uses, memory channels with wider data paths are more frequently found. Yet, common-sized TSOPs such as 66-pin and 54-pin packages are not commonly available in 32-bit data path configurations. Therefore, stacked modules that employ TSOPs have not been available in reliable configurations for 32-bit and other wide data path applications.

What is needed, therefore, is a technique and system for stacking integrated circuits that provides a thermally efficient, robust structure that provides a wider data path for the stacked module than present in the ICs of the module constituent while providing reliable performance with readily understood construction.

SUMMARY OF THE INVENTION

The present invention provides a system and method for selectively stacking and interconnecting individual integrated circuit devices that have a data path of n-bits to create a high-density integrated circuit module adapted for a data path of greater than n-bits. It is principally devised for use with memory circuits, but the invention can be employed to advantage with any type of packaged and leaded integrated circuit where area conservation and use of duplicative circuitry are present considerations and there is a need for the module to express a data path wider than that of the constituent elements of the stack.

Integrated circuits are vertically stacked one above the other. In a preferred embodiment, the stack consists of two packaged integrated memory circuits, but alternative embodiments may employ greater numbers of ICs, whether those ICs are memory or other circuits.

In a stacked module created in accordance with a preferred embodiment of the present invention, the constituent IC elements act in concert to provide an assembly of memory capacity approximately equal to the sum of the capacities of the ICs that constitute the assembly. Where the constituent IC elements have a data path of n-bits in width, a module devised in accordance with a preferred embodiment of the present invention presents a data path 2n-bits wide. The module may be used in a variety of applications such as, for example, individually as mounted on a circuit or motherboard or a plurality of modules devised in accordance with the present invention may be mounted on a dual-in-line (DIMM) board.

In a preferred embodiment, an interconnection frame comprised of printed circuit board material is disposed about two similarly oriented ICs to provide interconnectivity for the constituent ICs. Along lengths of the interconnection frame, there are pads for connection with the constituent ICs and a set of module connection pads through which connection of the module to a carrier or motherboard or other application environment is made. An array of clip-leads or other connectors are appended to the module connection pads to provide lead-like structures for connection of the module to its operating environment. Through the interconnection frame, adjacent ICs of the stack are interconnected. In a two-high stack, address lines of the constituent ICs are interconnected, while the data lines of the respective ICs are concatenated to double the data path width of the stack relative to the data path width of the constituent ICs. Other embodiments may combine the data paths of the constituent ICs either by concatenation or other arrangements to create a larger module data path than is presented by the constituent ICs of the module.

In an alternative preferred embodiment, two facially juxtaposed TSOP ICs are surface mounted to an interconnection body laterally positioned between the ICs. The interconnection body has IC connection pads and a set of module connection pads for connection of the module to a mother or carrier board. The interconnection body has a network of connections that interconnects the address lines of the constituent ICs and concatenates the data lines to double the data path width of the stack relative to the data path width of the ICs from which the stack is composed. An array of clip-leads or other connectors is appended to the module connection pads to provide lead-like structures for connection of the module to its operating environment.

DETAILED DESCRIPTION OF PREFERRED EMBODIMENT

Figure 1:
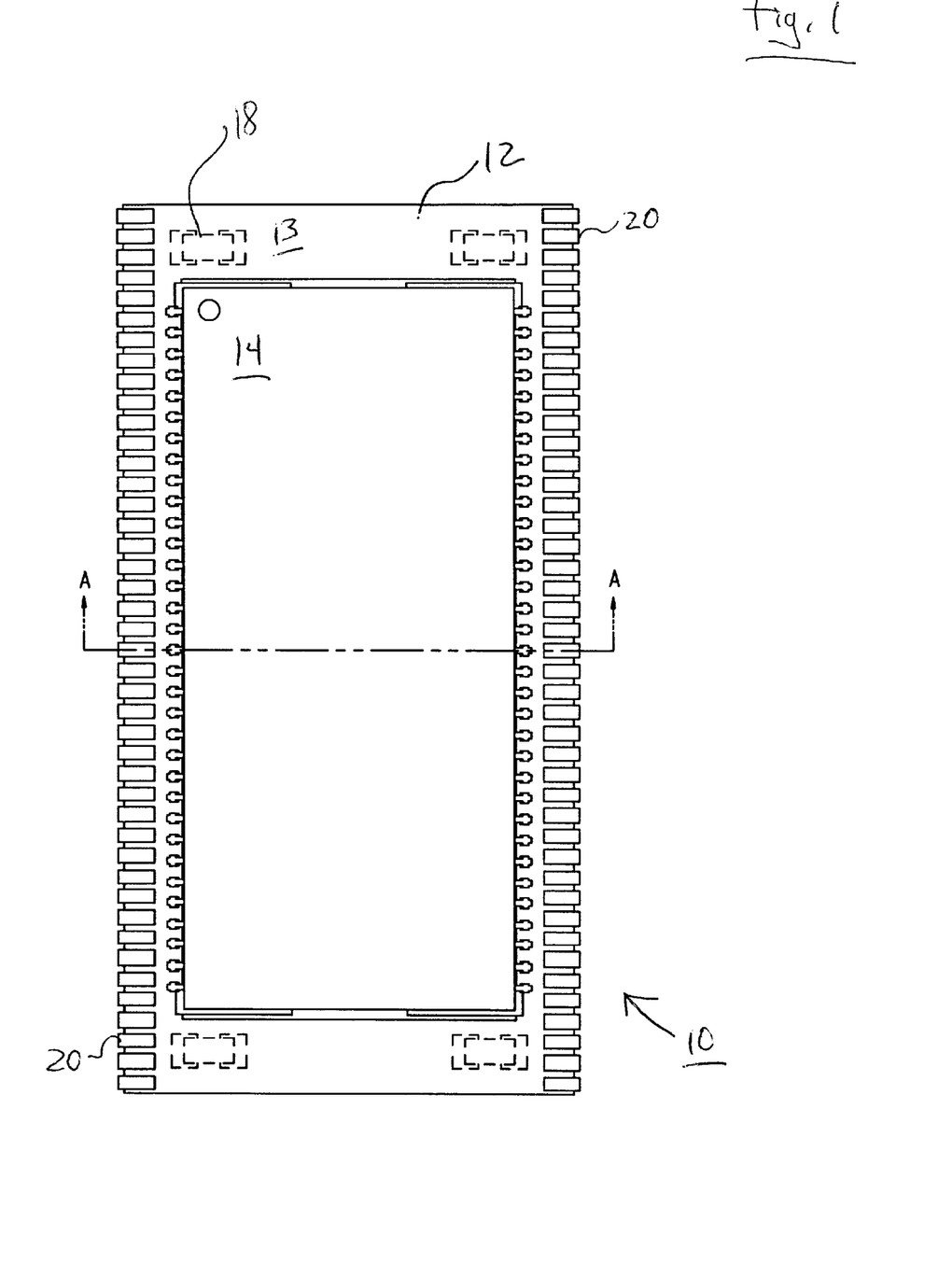
FIG. 1 depicts a plan view of a preferred embodiment of the present invention.

FIG. 1 depicts a plan view of a preferred embodiment of the present invention. Depicted module 10 stacks integrated circuits arranged and connected according to a preferred embodiment of the present invention. Module 10 may be referred to variously herein as "stack 10" or "module 10" or "stacked module 10." Module 10 includes an interconnection structure in the form of interconnection frame 12 that has an upper side 13 seen in FIG. 1 and a lower side 15 identified in later figures. Interconnection frame 12 may be referred to variously as frame 12 or interconnection frame 12. An interconnection frame suitable for use in embodiments of the present invention may be composed of a variety of materials such as, preferably, printed circuit or wire board (PCB, PWB). Alternatively, frame 12 may be composed from other substrate material that can support a network of connectors either on its surface or embedded within the structure. PCB and PWB technology is well understood by those in the art and creation of an appropriate frame 12 in correspondence with the teachings herein is well within the skill of those in the art. In a preferred embodiment, frame 12 is composed from PCB or PWB material. In the preferred embodiment described here, the interconnection network can be expressed as traces on the surface of the PWB or PCB or, in a multilayer PCB or PWB, with internal connectives or a combination of internal and external connectives. Other example materials that can be employed for frame 12 include ceramics, such as $Al_2O_3$ and BeO.

Frame 12 may present a border around all sides of module 10 as in the depicted preferred embodiment, or it may be composed of individual substrate elements or strips aligned along lead-emergent sides of the ICs that comprise module 10. Upper side 13 of interconnection frame 12 provides connection pads for the leads of upper IC 14 shown here, while on lower side 15 there are pads for lower IC 16. Upper IC 14 is disposed above lower IC 16 which is, therefore, not visible in this view. Four dotted line areas 18 identify the location on lower side 15 of optional noise suppression capacitors that will be more fully shown in later FIG. 4. An array of clip-leads 20 provides connective facility for module 10 and will be shown in greater detail in association with interconnection frame 12 in later FIGS. 3 and 4.

Figure 2:
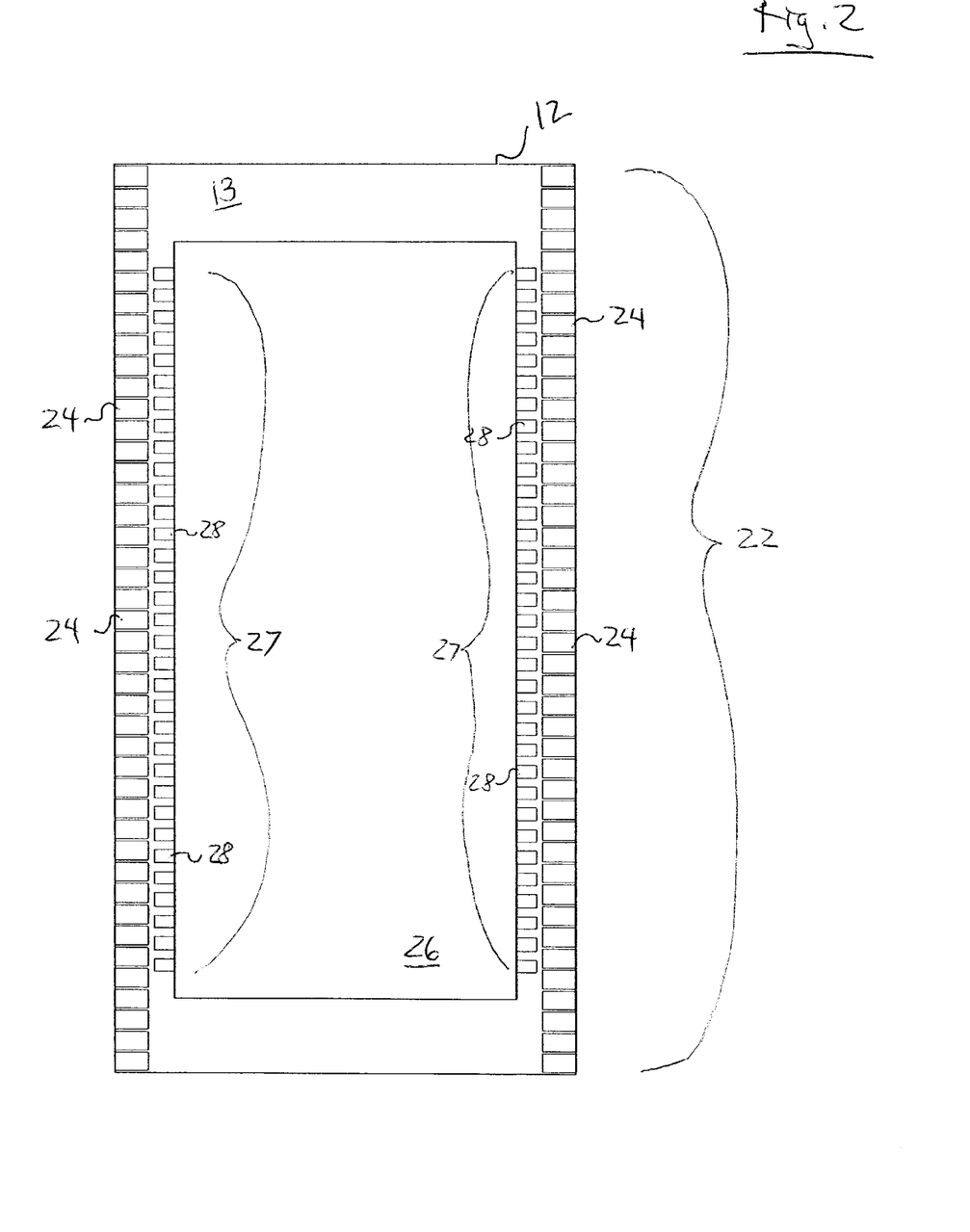
FIG. 2 is a plan view of an interconnection frame that may be employed in the preferred embodiment of the invention depicted in FIG. 1.

FIG. 2 depicts interconnection frame 12 as employed by the preferred embodiment of FIG. 1. Through an interconnection network, frame 12 selectively interconnects the constituent ICs of module 10 with a set 22 of module pads 24 through which clip-leads 20 provide connective facility for module 10. Those of skill in the art will understand how to configure an appropriate interconnection network for frame 12 in accordance with the teachings herein. An exemplar preferred pin-out of the embodiment of FIG. 1 is mapped in FIG. 5.

Figure 3:
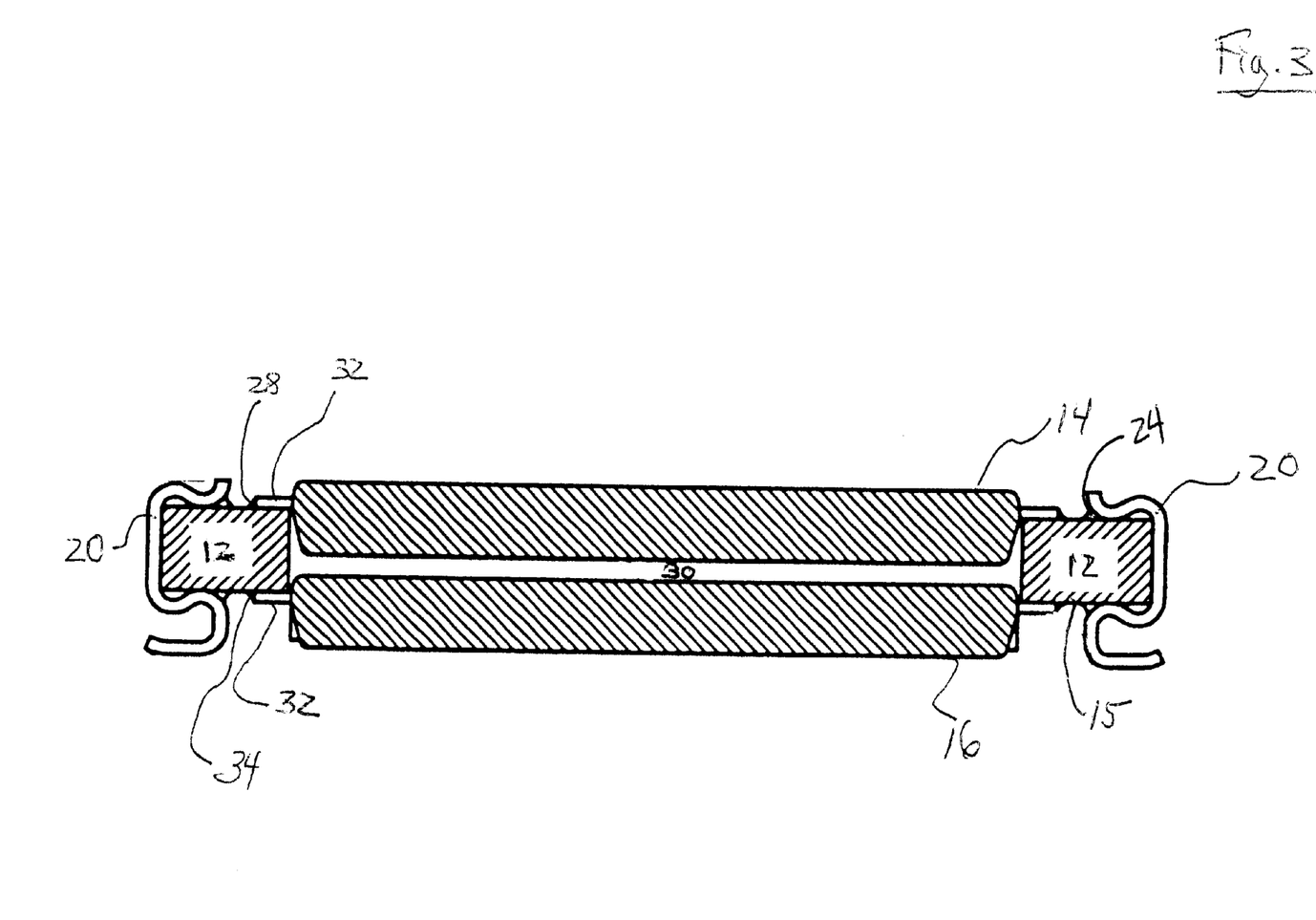
FIG. 3 is a cross-sectional view along line A—A of FIG. 1.

In a preferred embodiment, frame 12 presents a window space 26 created by the perimeter structure of frame 12. As shown in FIG. 3, in a preferred embodiment, a part of the bodies of upper IC 14 and lower IC 16 project into window space 26. In the depicted preferred embodiment, the projection is partial but in other embodiments it may be whole. With continuing reference to FIG. 2, along the upper surface 13 of frame 12 reside a set 27 of upper IC pads 28. In FIG. 2, to conserve a reasonable aspect to the depicted view, only four such pads 28 are identified by reference numerals, but it should be understood that the plurality shown along the perimeter of window 26 may be so identified. Pads 28 need not reach to the perimeter of window 26 but happen to do so in this embodiment. Pads 28 do, however, provide connection facility for upper IC 14 and so will generally be more proximal to window 26 of module 10 than module pads 24. The invention could be constructed with the module pads closer to the window than pads 28 but such a structure is not preferred. Pads 28 and module pads 24 can be pads as understood in surface mount technology or may be parts of traces or, alternatively, any connective surface with which the constituent ICs may make contact may be employed as pads 28 while module pads 24 need only provide a connective surface for the module 10 or clip-leads 20. Module pads 24 will, in some rare cases, provide the connective surface for the module to its application environment, but more particularly, clip-leads 20 are appended to module pads 24 to provide a module connection array amenable for mounting module 10. Module pads 24 may extend from upper surface 13 of frame 12 over the edge to lower surface 15 of frame 12. Pads 28 on the other hand, provide connection of upper IC 14 to frame 12 but another set of pads similar to pads 28, but not necessarily connected to pads 28 in a one-to-one correspondence, are provided on the lower surface 15 of frame 12 for connection to lower IC 16. An example site of one of such lower IC pads is identified in FIG. 3 as reference 34.

Structures other than the depicted clip-leads 20 may provide the connectivity between module 10 and the application environment. Alternative structures such as through-hole pins, surface mount pins, springs, tabs, sockets, and flexible or rigid PWB or PCBs can provide connection between module 10 and its application and such other structures may be employed in place of the clip-lead 20 configuration shown.

FIG. 3 illustrates how part of the lower part of the body of upper IC 14 and the upper part of the body of lower IC 16 project into window space 26. In the depicted embodiment, upper IC 14 is disposed as shown, above lower IC 16. IC 14 and IC 16 are oriented similarly where like pins are one above the other from IC to IC. As will be shown in another preferred embodiment, the constituent ICs (i.e., IC 14 and IC 16 where there are two ICs in module 10) need not be oriented similarly.

When upper IC 14 and lower IC 16 are disposed in frame 12, a residual site 30 may remain between the ICs and be an air gap or such site 30 may have resident a thermally conductive material. There are many available options for appropriate thermal materials such as boron nitride, silver or aluminum oxide could also be employed, for example. In other embodiments, there may be contact between the respective bodies of upper IC 14 and lower IC 16.

FIG. 3 depicts a clip-lead 20 on each lead-emergent side of module 10. It should be understood that an array of such clip-leads are employed in a preferred embodiment to provide connection between module 10 and its application environment such as connection to a motherboard. Also shown in FIG. 3, leads 32 of upper IC 14 are connected to upper IC pads 28. There is a set of pads 34 on lower surface 15 of frame 12 that provide connective facility for lower IC 16 leads 32. In the depiction of FIG. 3, leads 32 have been trimmed from their typical configuration as presented on TSOPs supplied from the manufacturers. Because the present invention provides a module 10 having a data path wider than the constituent ICs of module 10, there is not necessarily a connection between pads 28 and pads 34 even though the respective pads may be in corresponding positions only differing by whether they are on upper surface 13 or lower surface 15 of frame 12.

Figure 4:
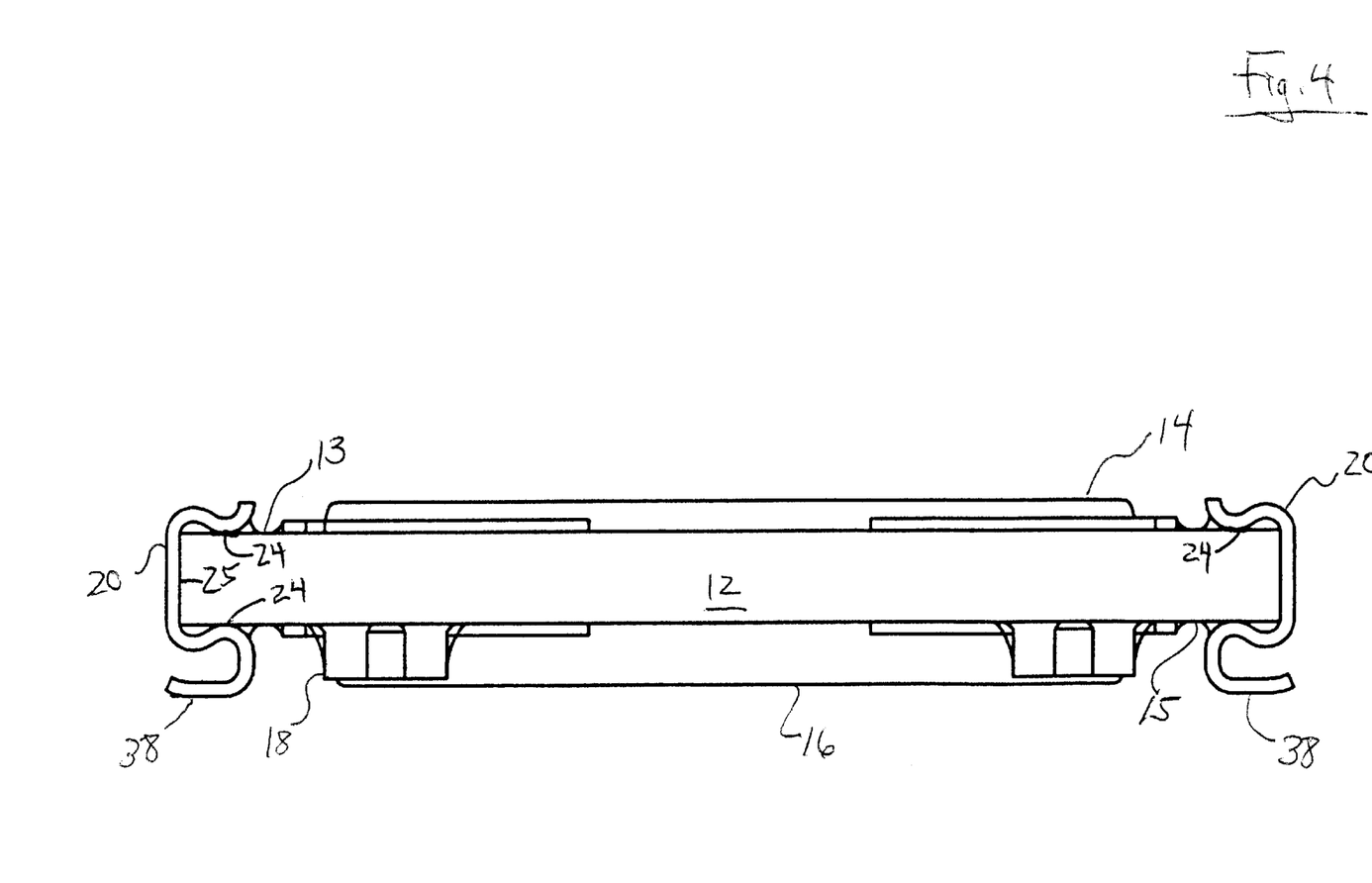
FIG. 4 is an end view of the embodiment of FIG. 1.

FIG. 4 illustrates module 10 of FIG. 1 from an end-view. It shows optional noise capacitors 18 and identifies feet 38 of clip-leads 20 that provide surface mount capability for module 10. FIG. 4 also shows module pads 24 being in contact with clip-leads 20. Although shown in FIG. 4 as being on both upper surface 13 and lower surface 15 of frame 12, module pads 24 need not be on both surfaces. They may also extend over the peripheral side 25 of frame 12 but this is not required.

Figure 5:
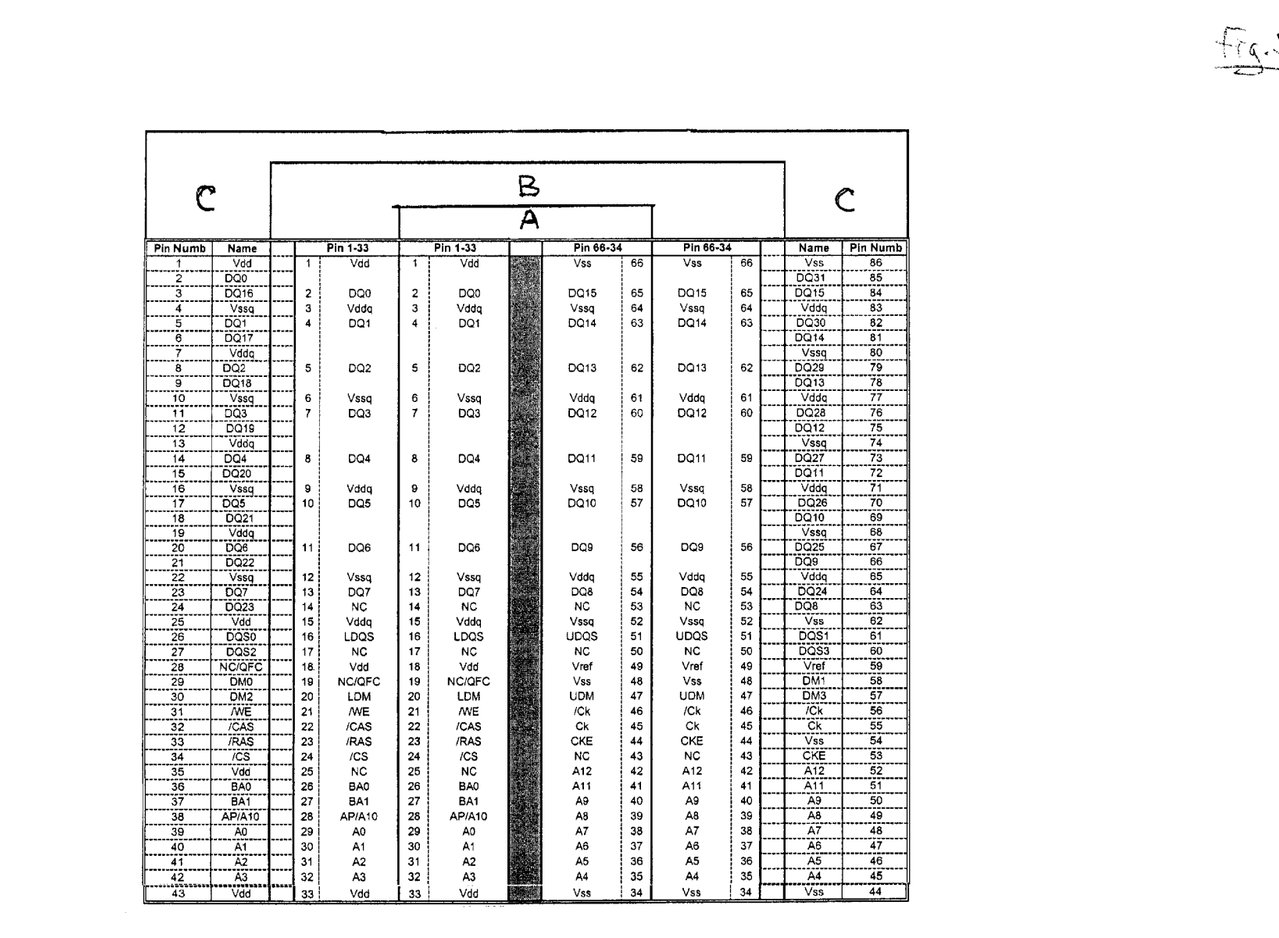
FIG. 5 is a pin-out table for the preferred embodiment of FIG. 1.

FIG. 5 is a pin-out table for the preferred embodiments of FIGS. 1–4. The two-columnar central part of the table of FIG. 5 symmetrically disposed about the central line of the table and labeled "A" identifies the functions of each of pins 1–66 in a 66-pin TSOP DDR SDRAM which occupies the role of lower IC 16 in a preferred embodiment of the present invention as provided by the assignee of the present invention. The identified pins of lower IC 16 are connected to pads 34 along lower surface 15 of frame 12. The next outermost two columns (one to the right side and one to the left side of the table of FIG. 5) identified by the reference "B" identify the functions of each of pins 1–66 in a 66-pin TSOP DDR SDRAM which occupies the role of upper IC 14 in a preferred embodiment of the present invention as provided by the assignee of the present invention. The pins of upper IC 14 are connected to pads 28 disposed along upper surface 13 of frame 12. Both of the TSOP-packaged DDR circuits are depicted in this embodiment with a 16-bit wide data path as shown in FIG. 5.

The columns of the table of FIG. 5 identified by the reference "C" identify the functions available at each of pins 1–86 of module 10. Clip-leads 20 provide the pins for module 10 and are connected to module pads 24 along the outer extents of frame 12. As shown in columns C of FIG. 5, the module 10 data path available on selected module pads 24 exhibits a 32-bit width. Connections are routed on or through frame 12 to concatenate the two 16-bit data path widths of the respective ICs to create the module data path of 32 bits. When concatenation is employed in a preferred embodiment of the present invention, it may be with either upper IC 14 or lower IC 16 supplying the high or low order byte or bytes of the module data path. Other forms of combination besides concatenation may be employed in the present invention, but concatenation of the respective data paths of the constituent ICs is the preferred combination arrangement to express the wider module data path by the interconnection structure. In a preferred embodiment, upper IC 14 provides the low order 4 bytes. That is, DQ0–DQ15 of upper IC 14 correspond to and are electrically connected to DQ0–DQ15 of module 10 while DQ0–DQ15 of lower IC 16 correspond to and are electrically connected to DQ16–DQ31 of module 10. Those of skill will note that although DQ0–DQ15 of each of upper IC 14 and lower IC 16 are disposed one above the other in this preferred embodiment, those lines are not connected. Other lines such as address lines are connected to each other and module 10 module pads 24 in physically corresponding positions in this embodiment. Another preferred embodiment will show that such physical correspondence is not necessary to the invention. As those of skill will recognize as to the embodiment mapped in FIG. 5, the physical mapping of the data lines from the constituent ICs to the module pads 24 of module 10 is dictated by the size of the ICs (i.e., pin count as one factor) and the size available for module 10 in the application environment. In this embodiment where two ICs are disposed in like orientation, a sensible physical mapping of upper IC 14 would be to nearby module pads 24 and, therefore, to clip-leads of module 10, while the corresponding data lines from lower IC 16 would sensibly be mapped to a module 10 pad 24 at a position nearby to the mapping of the corresponding pin from upper IC 14. The actual physical mapping will depend upon design choices and application. For example, with reference to FIG. 5, DQ4 from column B (left hand side) is pin 8 of upper IC 14 and maps to pin 14 of module 10 (through clip-leads 20). Because in this embodiment, upper IC 14 and lower IC 16 are identical, pin 8 of lower IC 16 is also DQ4 on that IC but is mapped to pin 15 of module 10 and is DQ20 of module 10.

Figure 6:
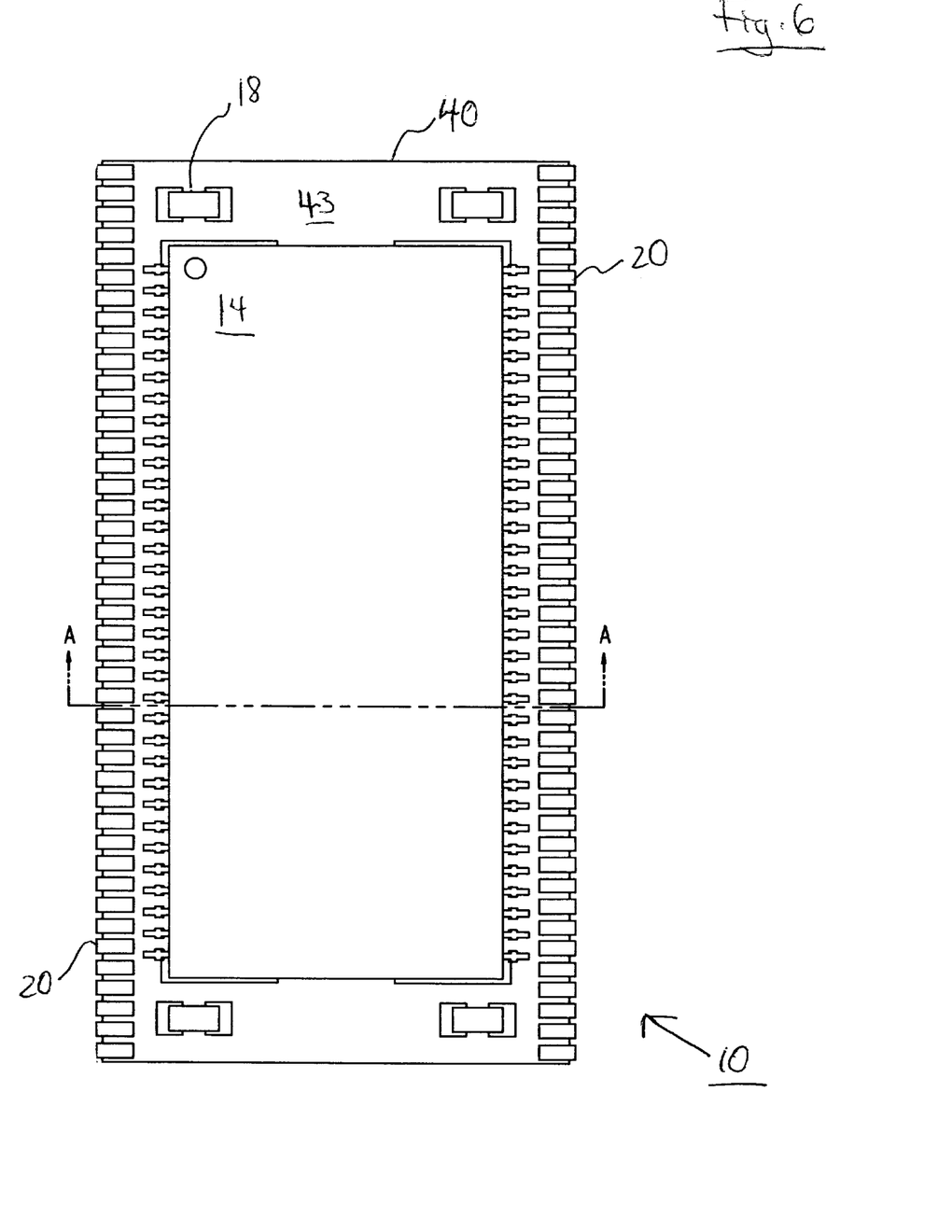
FIG. 6 is a plan view of an alternative preferred embodiment of the present invention.

FIG. 6 is a plan view of an alternative preferred embodiment of the present invention. Module 10 includes an interconnection structure in the form of interconnection body 40 which has an upper side 43 seen in FIGS. 6 and 7 and a lower side 45 identified in later figures. Upper side 43 of interconnection body 40 provides connection pads for the leads of upper IC 14 shown here while on lower side 45 there are pads for lower IC 16. As with interconnection frame 12, interconnection body 40 need not provide literal "pads" for connection of the ICs of module 10, but may employ any connective site such as, for example, uninsulated portions of connective traces for connective facility with the ICs. Upper IC 14 is disposed above lower IC 16 which is, therefore, not visible in this view.

In the embodiments shown in FIGS. 6 through 9, upper IC 14 and lower IC 16 are facially juxtaposed about, and connected to interconnection body 40 through which the leads of the ICs are selectively connected and through which constituted module 10 is connected to its application environment. IC 16 is inverted and disposed so that pin 1 of lower IC 16 is located approximately beneath the highest number pin of upper IC 14. Each of ICs 14 and 16 are surface mounted to interconnection body 40 in this preferred embodiment.

Figure 7:
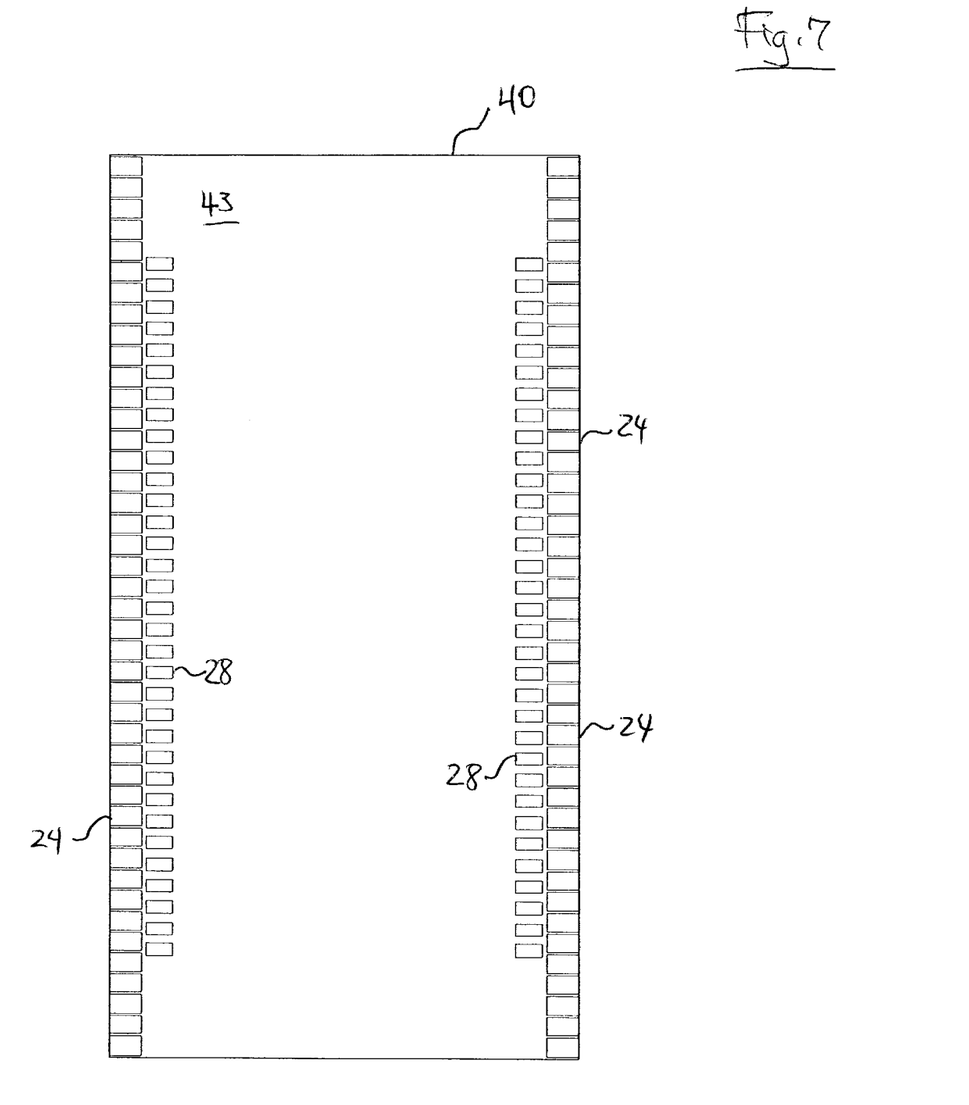
FIG. 7 is a plan view of an interconnection body that may be employed in the preferred embodiment of the invention depicted in FIG. 6.

FIG. 7 depicts interconnection body 40 as employed by a preferred embodiment of the present invention. Interconnection body 40 has no window and is, preferably, composed of PCB or PWB material to provide the interconnections to selectively connect upper and lower ICs 14 and 16, respectively. Interconnection body 40 may be composed of any substrate material that can support appropriate interconnections to selectively interconnect the constituent ICs to each other and to the module pads 24. In a preferred embodiment, module pads 24 provide connective surfaces for clip-leads 20 used to provide connective facility for module 10. Upper IC pads 28 are surface mount pads in a preferred embodiment and provide a connection site for upper IC 14. There are similar lower IC pads 34 present on the lower surface 45 of interconnection body 40. Areas 18 identify optional noise suppression capacitors.

Figure 8:
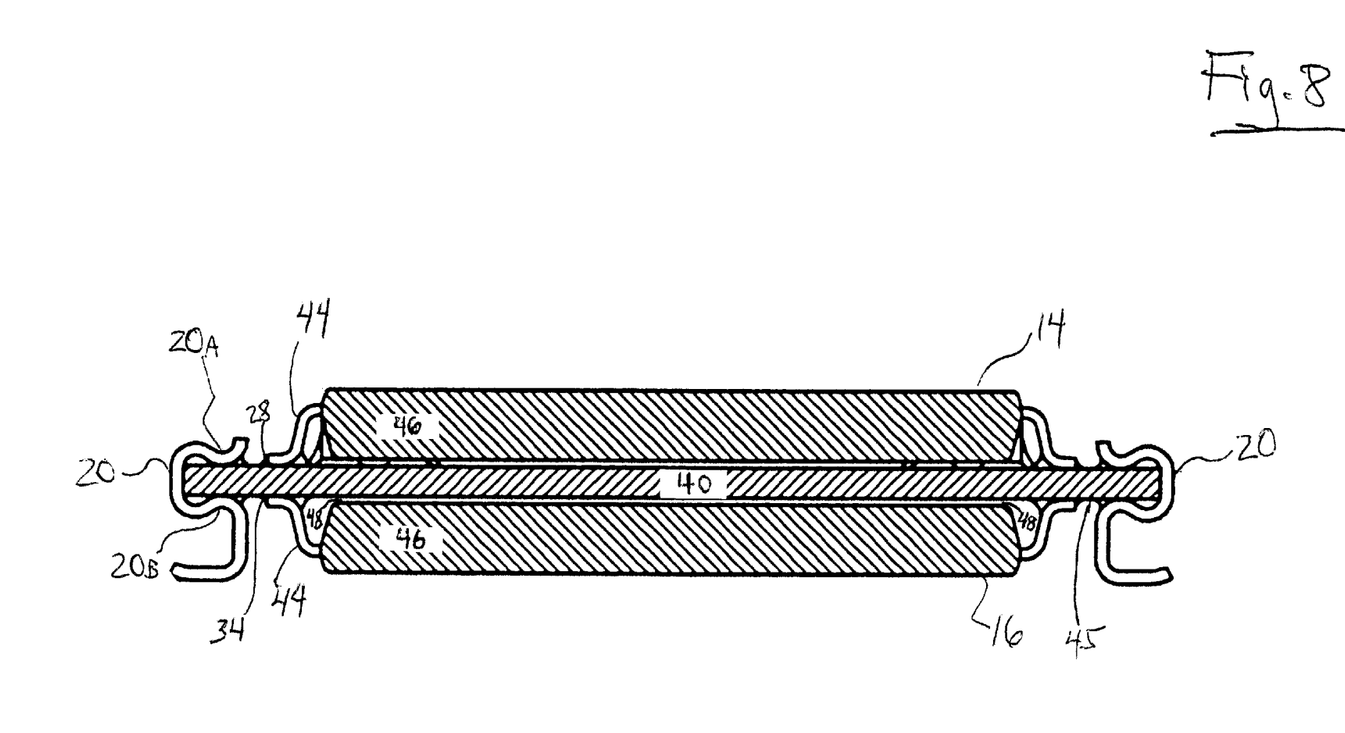
FIG. 8 illustrates a cross-sectional view along line A—A of FIG. 6.
Figure 9:
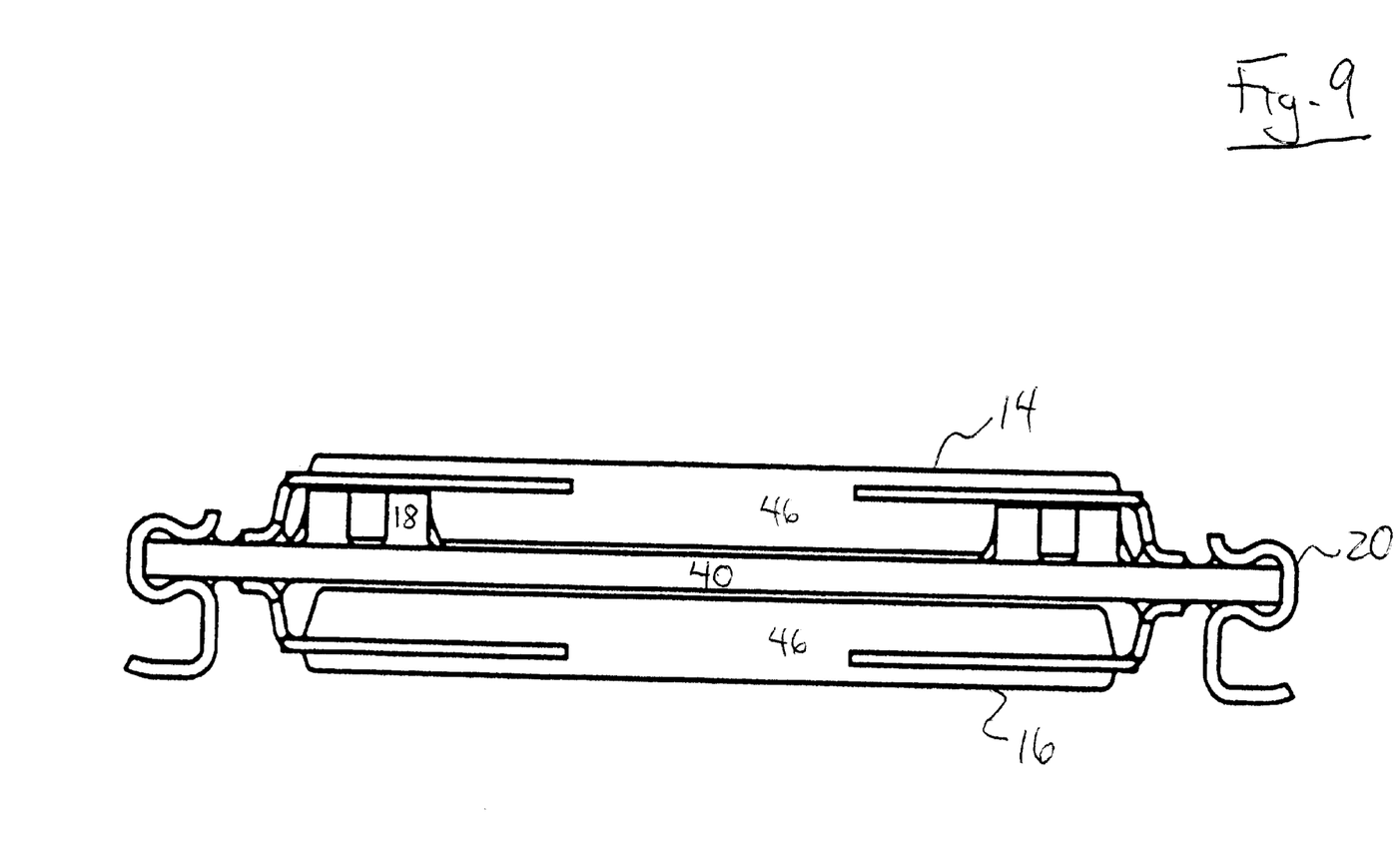
FIG. 9 depicts an end view of the embodiment depicted in FIG. 6.

FIG. 8 is a cross-sectional view of the embodiment of FIG. 6 taken along line A—A of FIG. 6. Shown in FIG. 8 are upper IC 14 and lower IC 16 with IC 14 disposed as shown, above lower IC 16. As those of skill in the art will recognize by the shape of the constituent TSOP ICs employed in this embodiment, IC 16 is inverted relative to IC 14. Leads 44 on the constituent ICs differ from leads 32 shown earlier in that leads 32 were trimmed while leads 44 are employed as supplied on the TSOP by the TSOP manufacturer. Leads 44 of upper IC 14 are surface mounted to pads 28 while leads 44 of lower IC 16 are mounted to pads 34 on lower surface 45 of interconnection body 40. Clip-leads 20 as employed in the example embodiment of FIG. 8 are narrower between points 20$_A$ and 20$_B$ than the corresponding points in clip-leads 20 in earlier depicted embodiments. FIG. 8 also identifies the typically plastic bodies of upper IC 14 and lower IC 16 by reference numeral 46. It should be understood that upper and lower ICs 14 and 16 respectively are, in a preferred embodiment, TSOPs with plastic bodies 46. The space 48, if any, between bodies 46 and interconnection body 40 may left as an air gap or filled with a thermally conductive media such as a conformal filler such as boron nitride, or silver or aluminum oxide, for example. FIG. 9 illustrates an end-on view of the embodiment of FIG. 6 showing upper IC 14 and lower IC 16 disposed about interconnection body 40.

Figure 10:
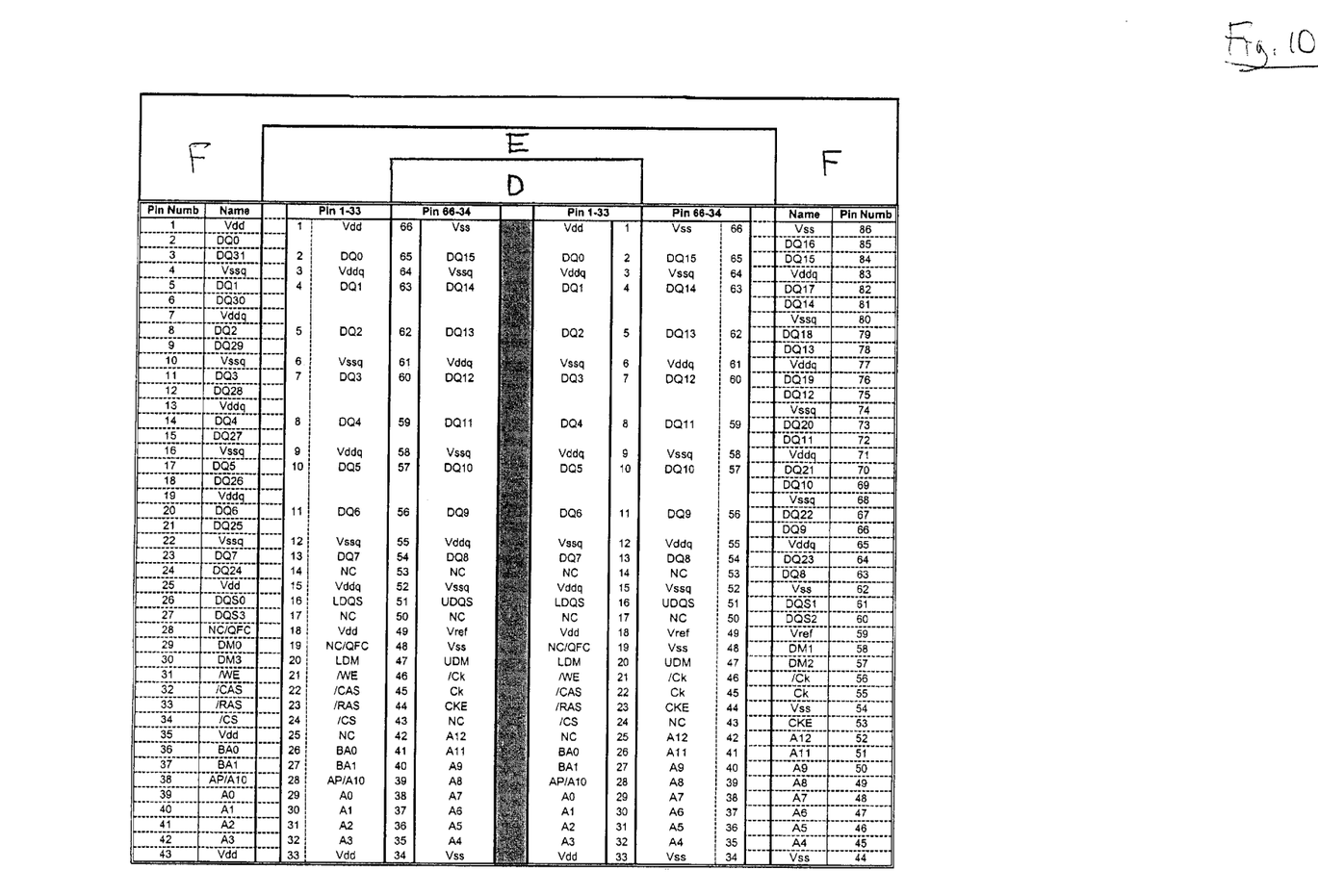
FIG. 10 is a pin-out table for the embodiment of FIG. 6.

FIG. 10 is a pin-out table for the preferred embodiment of FIG. 6. The two-columnar central part of the table of FIG. 10 symmetrically disposed about the central line of the table and labeled "D" identifies the functions of each of pins 1–66 in a 66-pin TSOP DDR SDRAM which occupies the role of lower IC 16 in a preferred embodiment of the present invention as provided by the assignee of the present invention. The identified pins of lower IC 16 are connected to pads 34 along lower surface 45 of connective body 40. The next outermost two columns (one to the right side and one to the left side of the table of FIG. 10) identified by the reference "E" identify the functions of each of pins 1–66 in a 66-pin TSOP DDR SDRAM which occupies the role of upper IC 14 in a preferred embodiment of the present invention as provided by the assignee of the present invention. The pins of upper IC 14 are connected to pads 28 disposed along upper surface 43 of connective body 40. Both of the TSOP-packaged DDR circuits are depicted in this embodiment with a 16-bit wide data path as shown in FIG. 10.

The columns of the table of FIG. 10 identified by the reference "F" identify the functions available at each of pins 1–86 of module 10 of the preferred embodiments shown in FIGS. 6–9. Clip-leads 20 provide the pins for module 10 and are connected to module pads 24 along the outer extents of body 40. As shown in columns F of FIG. 10, the module 10 data path available on selected module pads 24 exhibits a 32-bit width. Connections are routed on or through body 40 to concatenate the two 16-bit data path widths of the respective ICs to create the module data path of 32 bits. In a preferred embodiment, upper IC 14 provides the low order 4 bytes. That is, DQ0–DQ15 of upper IC 14 correspond to and are electrically connected to DQ0–DQ15 of module 10 while DQ0–DQ15 of lower IC 16 correspond to and are electrically connected to DQ16–DQ31 of module 10. Those of skill will note that corresponding leads DQ0–DQ15 of each of upper IC 14 and lower IC 16 are not connected to each other while other lines such as address lines are connected to each other and module pads 24. As this embodiment illustrates, physical correspondence is not necessary to the invention.

Figure 11:
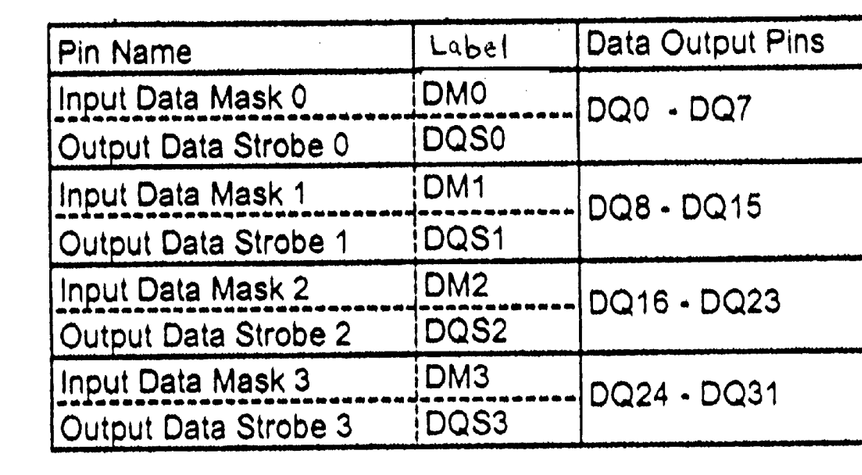
FIG. 11 is an output data strobe and input data mask table for a preferred embodiment of the present invention.

As those of skill will recognize as to the embodiment mapped in FIG. 10, although the physical mapping of the data lines from the constituent ICs to the module pads 24 of module 10 is dictated by the size of the ICs (i.e., pin count as one factor) and the size available for module 10 in the application environment, no particular requirement for pin arrangement is dictated for module 10 and interconnection body 40 may be configured to express a pin arrangement dictated by the application. In this embodiment where two ICs are juxtaposed, a sensible physical mapping of upper IC 14 is to nearby module pads 24 and, therefore, to clip-leads of module 10, while the nearby data lines from the juxtaposed lower IC 16 would sensibly be mapped to a module 10 pad 24 at a position nearby to the mapping of the corresponding pin from upper IC 14. The actual physical mapping will depend upon design choices and application. For example, with reference to FIG. 10, DQ4 from column E (left hand side) is pin 8 of upper IC 14 and maps to pin 14 of module 10 (through clip-leads 20). Because in this embodiment, upper IC 14 and lower IC 16 are identical but relatively inverted, pin 8 of lower IC 16 which is DQ4 on that IC, is mapped to pin 73 of module 10 and is DQ20 of module 10 whereas DQ11 is pin 59 of lower IC 16 and approximately beneath DQ4 of upper IC 14 and is physically mapped therefore close to DQ4 of upper IC at pin 15 of module 10 as DQ27. FIG. 11 provides an output data strobe and input data mask table for a preferred embodiment of the present invention.

Although the present invention has been described in detail, it will be apparent to those of skill in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

We claim:

1. A high density circuit module comprising:
   a first packaged integrated circuit having external leads including external leads defining a first IC data path;
   a second separately packaged integrated circuit having external leads including external leads defining a second IC data path, the first integrated circuit being disposed above the second integrated circuit;
   an interconnection structure having first and second oppositely facing sides, said first side having a plurality of first IC pads for receiving the external leads from the first integrated circuit package, the second side having a plurality of second IC pads for receiving the external leads from the second integrated circuit, a first set of module pads distributed proximal to and selectively interconnected to the plurality of first IC pads and a second set of module pads distributed proximal to and selectively interconnected to the plurality of second IC pads to provide a concatenation of the data paths of the respective first and second integrated circuits to express a module data path wider than the data paths from the individual integrated circuits on selected ones of the first and second sets of module pads.

2. The module of claim 1, wherein the first set of module pads are located on the first side of the interconnection structure, and the second set of module pads are located on the second side of the interconnection structure, the first and second sets of module pads being closer to the peripheral edge of the structure than the IC pads.

3. The module of claim 2, wherein the IC pads are aligned to receive a commercially available integrated circuit package.

4. The module of claim 1 further comprising clip-leads attached to selected ones of the first and second sets of module pads to interconnect selected ones of the first and second IC pads.

5. The module of claim 4, wherein the clip-leads connect selected ones of the first and second integrated circuit pads through the module pads to an operation environment.

6. The module of claim 1 in which the interconnection structure includes a thermal media in thermal-conductive contact with the first and second integrated circuits.

7. The module of claim 1 in which the first and second integrated circuits are TSOP-packaged memory circuits.

8. The module of claim 1 in which the interconnection structure is an interconnection frame having oppositely facing first and second window apertures for receiving the first and second integrated circuits.

9. An interconnection apparatus for facilitating an IC stack module, comprising:
   a frame having first and second opposing sides for receiving first and second separately packaged integrated circuits, the first integrated circuit having external leads including leads for a first IC data bus, and the second integrated circuit having external leads including leads for a second IC data bus;
   a plurality of first IC pads mounted to the first side of the frame and arranged to receive the external leads from the first integrated circuit package;
   a plurality of second IC pads mounted to the frame on the second side and arranged to receive the external leads of the second integrated circuit package;
   a set of first module pads mounted to the frame on the first side and being selectively interconnected to the plurality of first IC pads;
   a set of second module pads mounted to the frame on the second side and being selectively interconnected to the plurality of second IC pads,
   wherein the first and second module pads are selectively interconnected to each other to express a module data bus that is a combination of the first and second IC data busses.

10. The apparatus of claim 9, wherein the first and second sets of module pads are proximal to the frame's peripheral edge.

11. The apparatus of claim 10, wherein the pluralities of first and second IC pads are arranged to receive commercially available integrated circuit packages.

12. The apparatus of claim 9 further comprising clip-leads attached to selected ones of the first and second sets of module pads to interconnect selected ones of the first and second IC leads.

13. The apparatus of claim 12, wherein the clip-leads also connect selected ones of the first and second integrated circuit pads to an operational environment.

14. The apparatus of claim 9 in which the frame is formed from a thermally conductive media and is adapted to be in thermal-conductive contact with the first and second integrated circuit packages.

15. The apparatus of claim 9 in which the first and second integrated circuits are TSOP-packaged memory circuits, each with 32-bit data bus, the stack module resulting in a memory module having a 64-bit wide data bus.

16. The apparatus of claim 9 in which the frame's first side has a window aperture for receiving the first integrated circuit package, and the frame's second side has a window aperture for receiving the second integrated circuit package.

17. The apparatus of claim 16, wherein the IC pads are aligned next to the edges of the window apertures such that when the integrated circuit packages are operably mounted within the apertures, the leads are in conductive contact with the IC pads.

18. The apparatus of claim 17, wherein the first and second integrated circuit packages are TSOP memory devices whose external leads are clipped such that they project outwardly and lie on their associated IC pads when the IC device is inserted into its window aperture.

19. A high density circuit module comprising:
   a first memory device in a TSOP package with external leads, the memory device having a first device data path;
   a second memory device in a separate TSOP package with external leads, the second memory device having a second device data path;
   an interconnection structure having:
      a first major side bearing a set of first IC pads to which is connected the first memory device's external leads and having a second major side bearing a set of second IC pads to which is connected the second memory device's external leads,
      a set of first module pads mounted on the first major side and being selectively interconnected to the set of first IC pads,
      a set of second module pads mounted on the second major side and being selectively interconnected to the set of second IC pads,
      wherein selected ones of the first and second sets of module pads are interconnected such that the module provides a module memory device with a module data path that is a combination of the first and second device data paths.

20. The module of claim 19 in which the interconnection structure comprises thermally conductive media that is in conductive contact with both the first-and second memory packages.

21. An interconnection apparatus for stacking separately packaged first and second integrated circuit devices that each-have external leads and a data path, comprising;
 a frame having a top surface and a bottom surface, said frame defining a border on the bottom surface for surrounding said first integrated circuit package and said frame defining a border on the top surface for surrounding said second integrated circuit package;
 a plurality of lower IC pads provided on the bottom surface to connectively receive the external leads of the first integrated circuit device;
 a plurality of upper IC pads provided on the upper surface of said frame to connectively receive the external leads of the second integrated circuit device; and
 a set of module pads mounted on said upper and lower surfaces, the module pads selectively interconnected to said plurality of upper IC pads and said plurality of lower IC pads to provide a concatenation of the data paths of said respective first integrated circuit device and said second integrated circuit device to express a module data path on selected ones of said set of module pads.

22. The apparatus of claim 21, further comprising a plurality of surface-mountable chip-leads attached to said set of module pads.

23. The apparatus of claim 21, further comprising a thermal media, said thermal media adapted to lie between said first integrated circuit package and said second integrated circuit package.

24. The apparatus of claim 23, wherein said thermal media is air.

25. The apparatus of claim 23, wherein said thermal media is a thermally conductive material.

26. The apparatus of claim 21, wherein said upper IC pads are not electrically connected to said lower IC pads.

27. The apparatus of claim 21, wherein said first integrated circuit device and said second integrated circuit device are TSOP-packaged memory devices.

28. A high density circuit module, comprising:
 an upper integrated circuit having external leads and a an upper IC data path;
 a lower integrated circuit having external leads and a lower IC data path, said upper integrated circuit being disposed above said lower integrated circuit;
 an interconnection structure including:
  a frame having a top surface and a bottom surface, said frame exhibiting a window aperture; a plurality of upper IC pads provided on the top surface of said frame to which said upper integrated circuit is connected;
  a plurality of lower IC pads provided on the bottom surface of said frame to which the lower integrated circuit is connected; and
  a set of module pads provided on the top and bottom surfaces and selectively interconnected to said plurality of upper IC pads and said plurality of lower IC pads to provide a concatenation of the upper and lower IC data paths of said upper integrated circuit and said lower, integrated circuit to express a module data path that is a combination of the upper and lower IC data paths on selective ones of said set of module pads.

29. The high density circuit module of claim 28, wherein said first integrated circuit is disposed above said second integrated circuit within the window aperture of said frame.

30. The high density circuit module of claim 29, further comprising a plurality of surface-mountable chip-leads attached to said set of module pads.

31. The high density circuit module of claim 28, further comprising a thermal media lying between said first integrated circuit and said second integrated circuit.

32. The high density circuit module of claim 31, wherein said thermal media is air.

33. The high density circuit module of claim 31, wherein said thermal media is a thermally conductive material.

34. The high density circuit module of claim 28, wherein said first integrated circuit and said second integrated circuit are TSOP-packaged memory circuits.

* * * * *